(12) United States Patent
Fukasaku

(10) Patent No.: US 11,276,753 B2
(45) Date of Patent: Mar. 15, 2022

(54) TRANSISTOR AND ELECTRONIC APPARATUS

(71) Applicant: Sony Semiconductor Solutions Corporation, Kanagawa (JP)

(72) Inventor: Katsuhiko Fukasaku, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/634,334

(22) PCT Filed: Jun. 15, 2018

(86) PCT No.: PCT/JP2018/022960
§ 371 (c)(1),
(2) Date: Jan. 27, 2020

(87) PCT Pub. No.: WO2019/026440
PCT Pub. Date: Feb. 7, 2019

(65) Prior Publication Data
US 2020/0235205 A1 Jul. 23, 2020

(30) Foreign Application Priority Data

Aug. 1, 2017 (JP) .............................. JP2017-149097

(51) Int. Cl.
*H01L 29/06* (2006.01)
*H01L 27/088* (2006.01)
*H01L 29/78* (2006.01)

(52) U.S. Cl.
CPC ........ *H01L 29/0649* (2013.01); *H01L 27/088* (2013.01); *H01L 29/78* (2013.01)

(58) Field of Classification Search
CPC ................. H01L 29/0649; H01L 29/78; H01L 29/78606; H01L 29/78648;
(Continued)

(56) References Cited

U.S. PATENT DOCUMENTS

| 2009/0134468 A1* | 5/2009 | Tsuchiya ............. H01L 27/1104 257/368 |
| 2010/0084709 A1* | 4/2010 | Tsuchiya ............. H01L 27/1207 257/347 |
| 2015/0132862 A1 | 5/2015 | Hook et al. |

FOREIGN PATENT DOCUMENTS

| JP | 2000-196089 A | 7/2000 |
| JP | 2005-019799 A | 1/2005 |

(Continued)

*Primary Examiner* — Dao H Nguyen
(74) *Attorney, Agent, or Firm* — Michael Best & Friedrich LLP

(57) ABSTRACT

A transistor and electronic apparatus are disclosed. In one example, a transistor includes a semiconductor substrate containing an electrically-conductive impurity. A device separation layer defines a device region. A buried insulation layer is provided in the device region, and a gate electrode crosses the device region. A drain region and a source region are opposed to each other with the gate electrode in between in the device region. A concentration or a polarity of the electrically-conductive impurity in the semiconductor substrate in an end region including at least an end portion of the gate electrode on drain region side is different from a concentration or a polarity of the electrically-conductive impurity in the semiconductor substrate in a middle region including a middle portion of the gate electrode.

20 Claims, 7 Drawing Sheets

(58) Field of Classification Search
CPC ............. H01L 29/78654; H01L 27/088; H01L 27/0266; H01L 27/04; H01L 27/06; H01L 21/822
USPC .......... 257/268, 347, 350, 368, 392, E27.06, 257/E27.112, E29.063, E29.064, E29.273, 257/E29.286, E21.415, E21.66, E21.703
See application file for complete search history.

(56) References Cited

FOREIGN PATENT DOCUMENTS

| | | |
|---|---|---|
| JP | 2009-135140 A | 6/2009 |
| JP | 2010-212588 A | 9/2010 |
| JP | 2013-191760 A | 9/2013 |
| WO | 2007/004535 A1 | 1/2007 |

\* cited by examiner

[ FIG. 1 ]
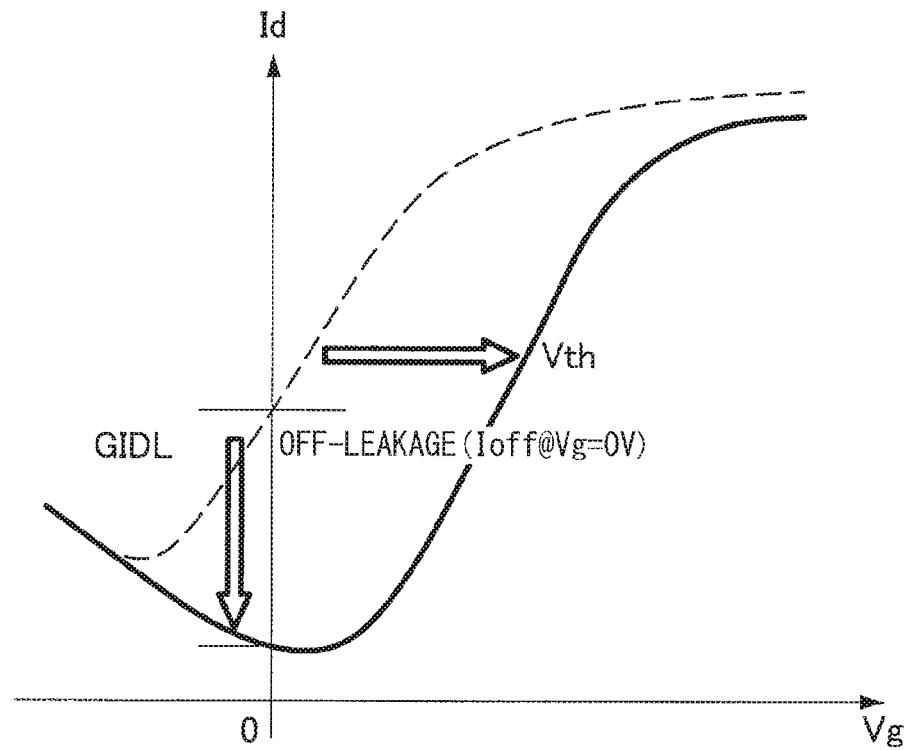
[ FIG. 2A ]
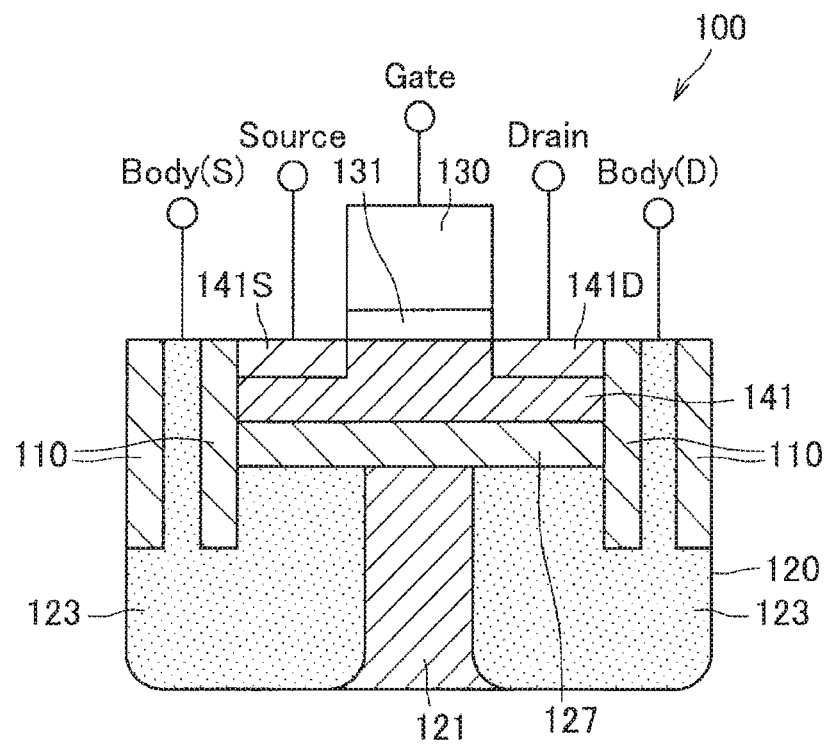

[ FIG. 2B ]
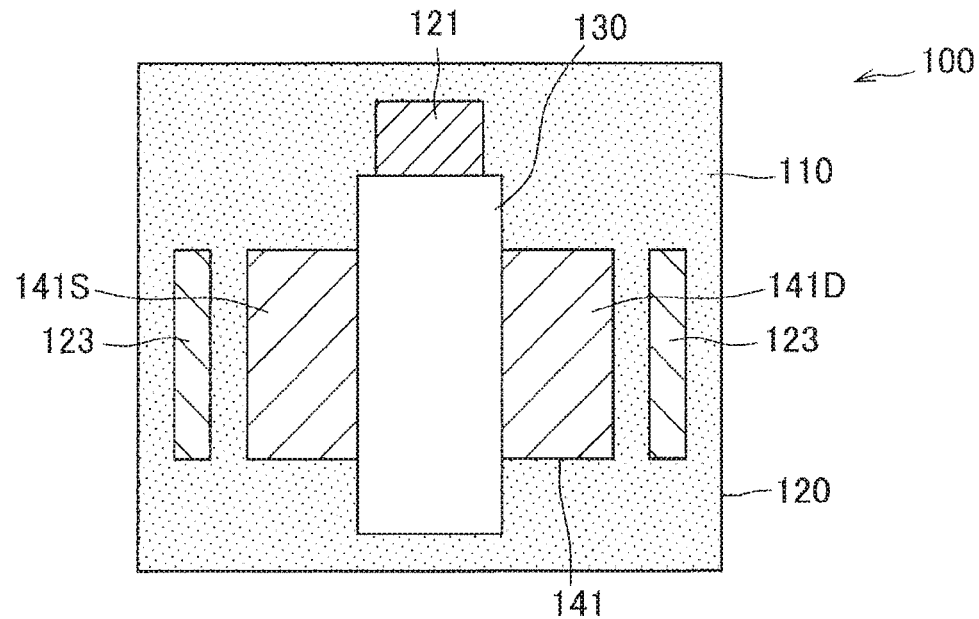
[ FIG. 2C ]
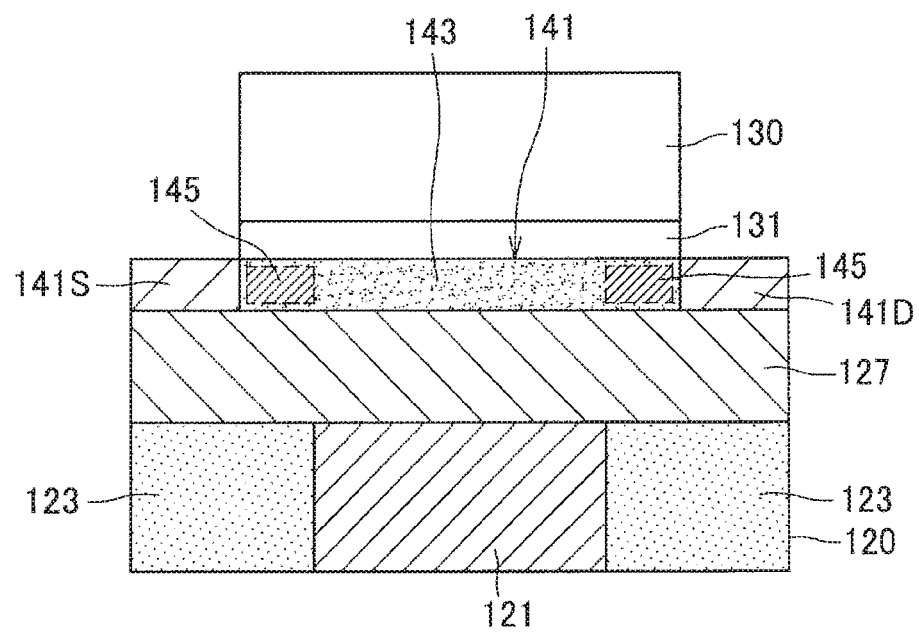

[ FIG. 3 ]
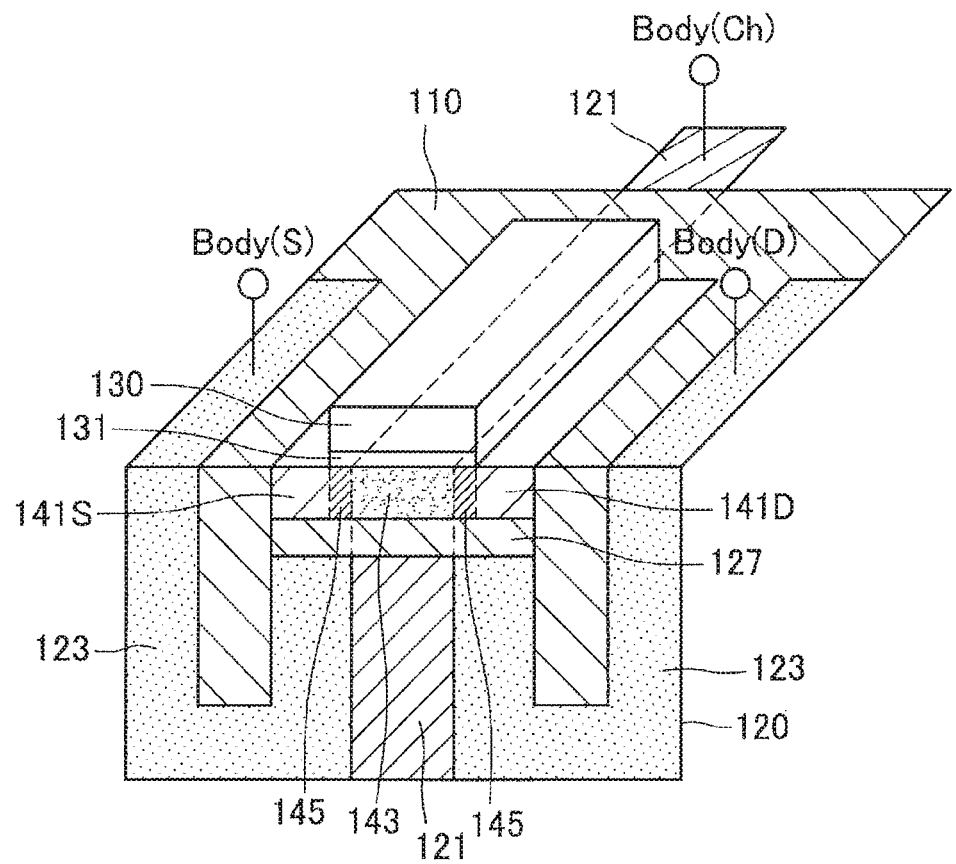
[ FIG. 4 ]
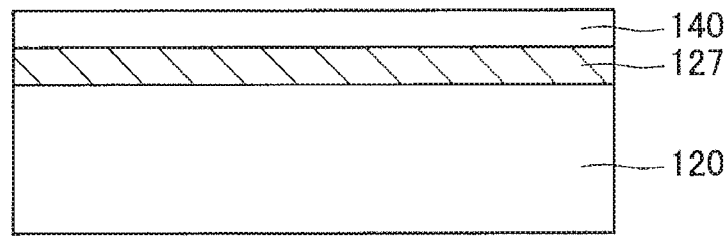
[ FIG. 5 ]
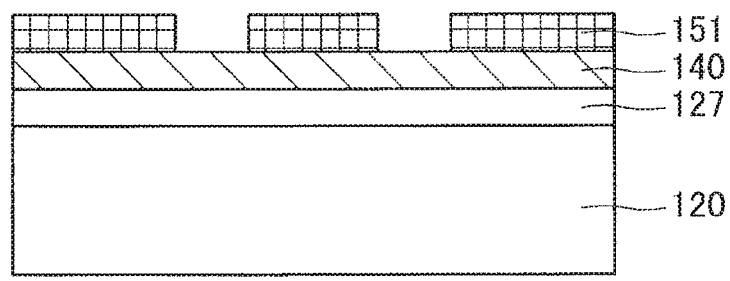

[ FIG. 6 ]
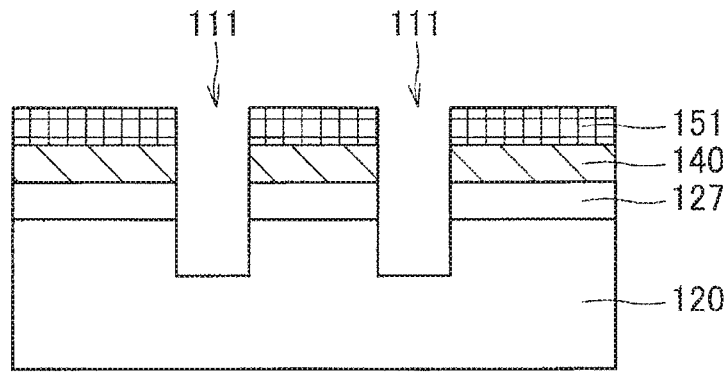
[ FIG. 7 ]
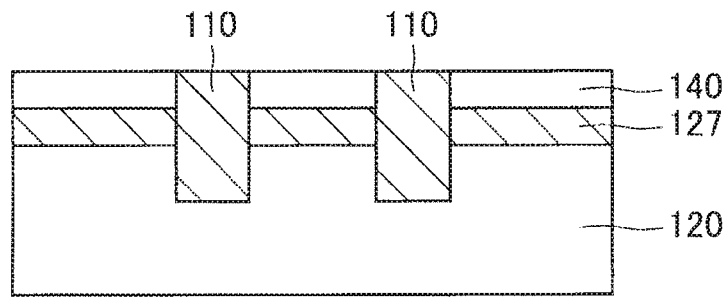
[ FIG. 8 ]
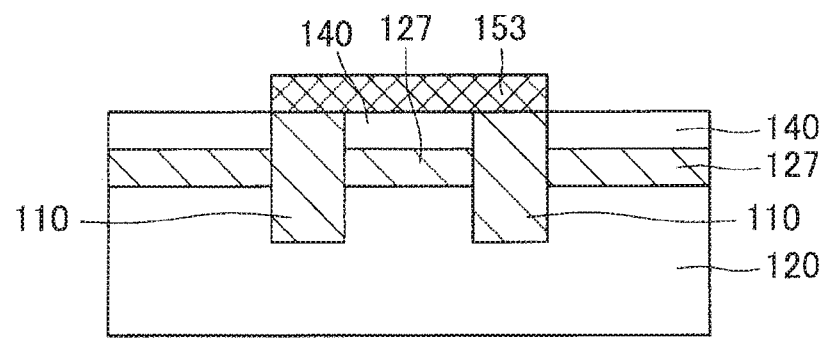
[ FIG. 9 ]
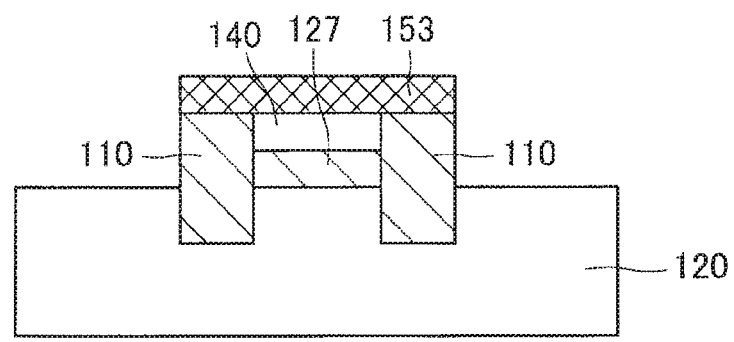

[ FIG. 10 ]
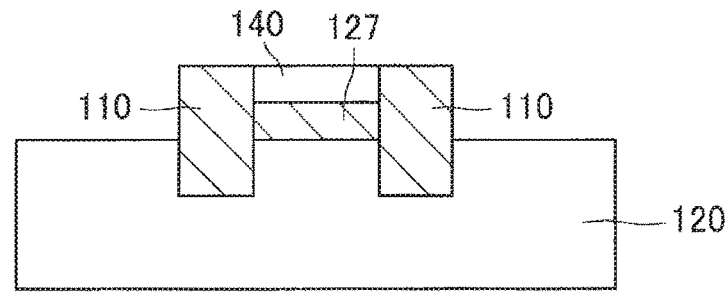
[ FIG. 11 ]
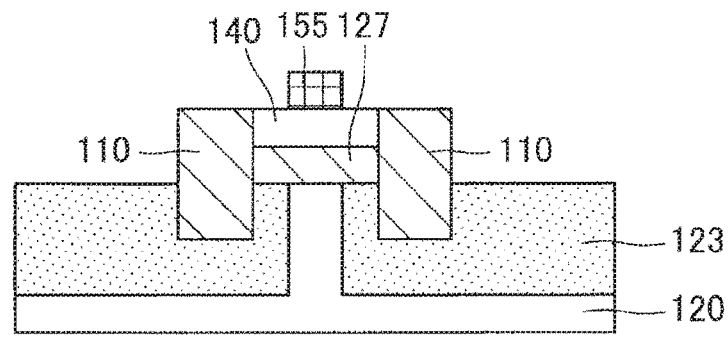
[ FIG. 12 ]
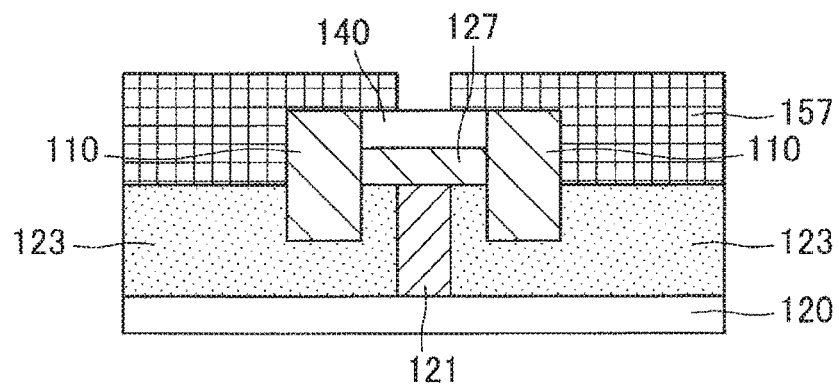
[ FIG. 13 ]
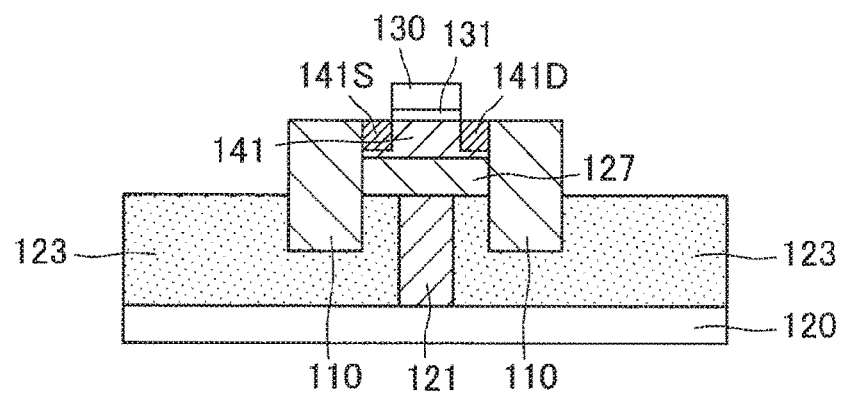

[ FIG. 14 ]
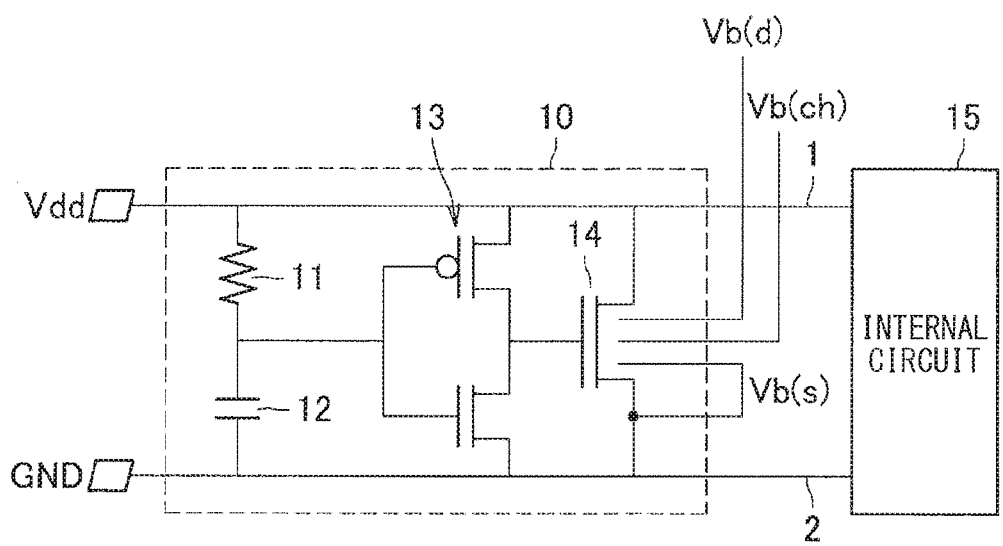
[ FIG. 15A ]
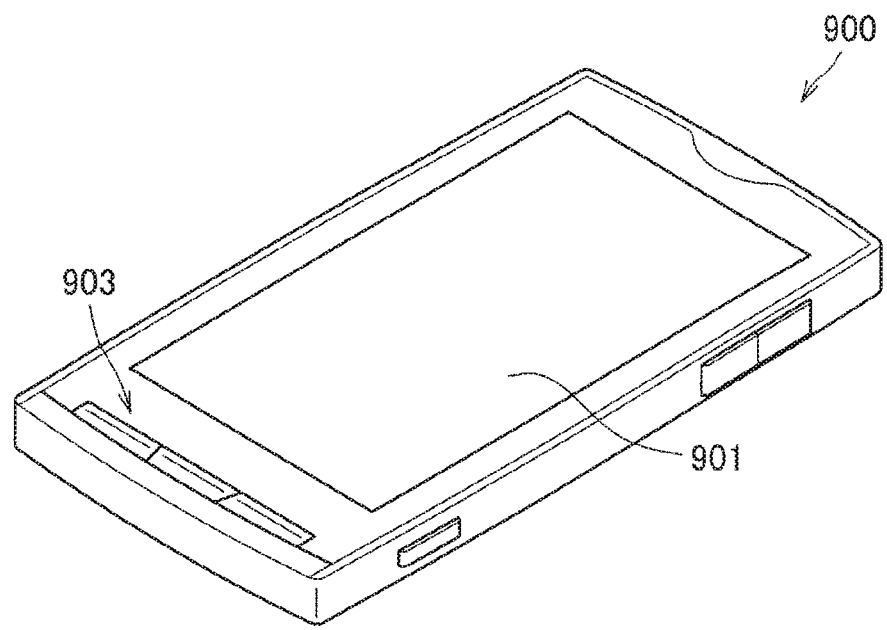

[ FIG. 15B ]
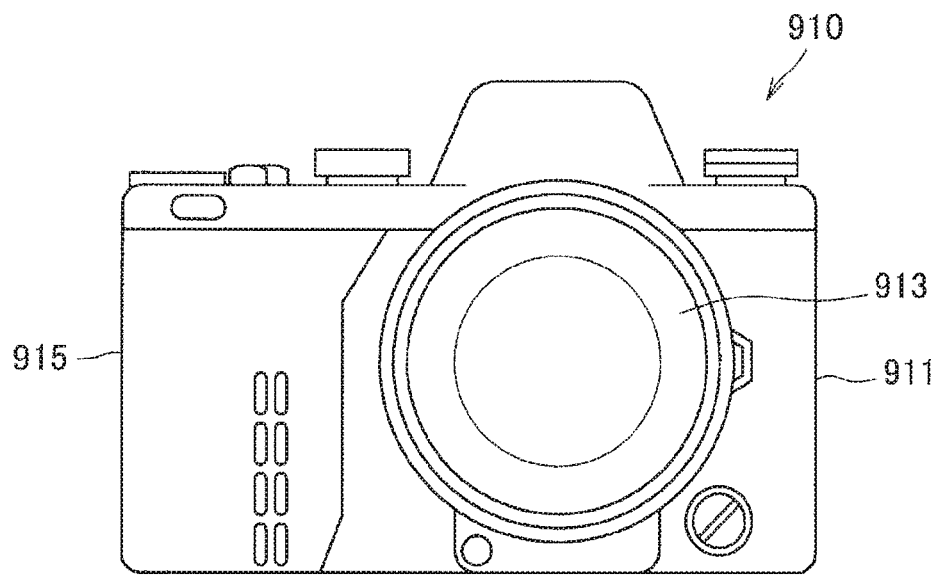
[ FIG. 15C ]
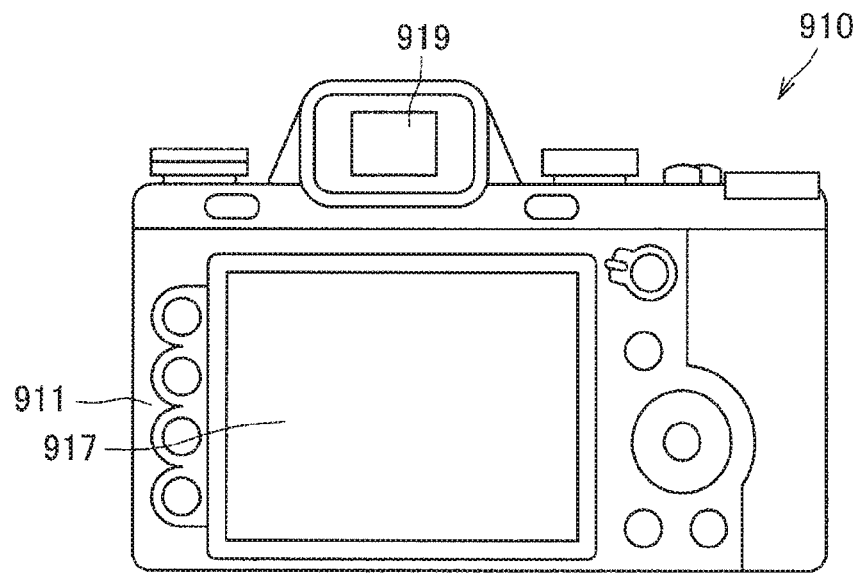

TRANSISTOR AND ELECTRONIC APPARATUS

TECHNICAL FIELD

The present disclosure relates to a transistor and an electronic apparatus.

BACKGROUND ART

In recent years, a field-effect transistor in an integrated circuit has been increasingly improved in performance and miniaturized.

However, the miniaturization causes a reduction in a channel length of the field-effect transistor, increasing a current (so-called off-state leakage current) flowing when the field-effect transistor is not in operation due to a short-channel effect. This is because the reduction in the channel length causes a carrier present in a channel region to be also influenced by a depletion layer in each of a source region and a drain region and, consequently, it becomes easier for a drain current to flow irrespective of whether or not a gate voltage is applied.

Accordingly, for example, the use of an SOI (Silicon On Insulator) substrate, which includes an insulation film referred to as a BOX (Buried OXide) layer sandwiched inside a silicon substrate, has been studied. In the SOI substrate, an SOI layer, which includes a source region, a drain region, and a channel region, and a substrate body are separated from each other by the insulation film, i.e., the BOX layer, allowing for restraining the influence of the depletion layer for a reduction in the off-state leakage current.

For example, PTL 1 below discloses an ESD (electro-Static Discharge) protection device that includes a field-effect transistor on an SOI substrate.

CITATION LIST

Patent Literature

PTL 1: Japanese Unexamined Patent Application Publication No. 2010-212588

SUMMARY OF THE INVENTION

Problems to be Solved by the Invention

However, since the ESD protection device disclosed in PTL 1 is intended for a reduction in manufacturing costs, control of transistor characteristics has not been sufficiently taken into consideration.

Accordingly, a technology according to the present disclosure has been made in view of the above circumstances. The present disclosure provides a new and improved transistor and an electronic apparatus that allow for an easier control of characteristics.

Means for Solving the Problem

According to the present disclosure, provided is a transistor that includes a semiconductor substrate, a device separation layer, a buried insulation layer, a gate electrode, a drain region, and a source region. The semiconductor substrate contains an electrically-conductive impurity. The device separation layer is provided toward inside of the semiconductor substrate from a surface of the semiconductor substrate. The device separation layer defines a device region. The buried insulation layer is provided inside the semiconductor substrate in the device region. The gate electrode is provided on the semiconductor substrate with a gate insulation film in between. The gate electrode crosses the device region. The drain region and the source region are provided in respective regions that are opposed to each other with the gate electrode in between in the device region. A concentration or a polarity of the electrically-conductive impurity in the semiconductor substrate in an end region including at least an end portion of the gate electrode on drain region side is different from a concentration or a polarity of the electrically-conductive impurity in the semiconductor substrate in a middle region including a middle portion of the gate electrode.

Furthermore, according to the present disclosure, provided is an electronic apparatus that includes a circuit. The circuit includes a transistor. The transistor includes a semiconductor substrate, a device separation layer, a buried insulation layer, a gate electrode, a drain region, and a source region. The semiconductor substrate contains an electrically-conductive impurity. The device separation layer is provided toward inside of the semiconductor substrate from a surface of the semiconductor substrate. The device separation layer defines a device region. The buried insulation layer is provided inside the semiconductor substrate in the device region. The gate electrode is provided on the semiconductor substrate with a gate insulation film in between. The gate electrode crosses the device region. The drain region and the source region are provided in respective regions that are opposed to each other with the gate electrode in between in the device region. A concentration or a polarity of the electrically-conductive impurity in the semiconductor substrate in an end region including at least an end portion of the gate electrode on drain region side is different from a concentration or a polarity of the electrically-conductive impurity in the semiconductor substrate in a middle region including a middle portion of the gate electrode.

According to the present disclosure, it is possible to locally control a threshold voltage of the transistor by changing the polarity or the concentration of the electrically-conductive impurity contained in the semiconductor substrate at and below the buried insulation layer between the middle region and the end region of the channel. This allows for restraining an increase in a GIDL (Gate Induced Drain Leakage) current while increasing a threshold voltage of the transistor as a whole.

Effects of the Invention

The present disclosure as described above allows for an easier control of characteristics of a transistor.

It is to be noted that the above effects are not necessarily limiting and any other effect described herein or another effect understandable from the description herein may be achieved in addition to the above effects or instead of the above effects.

BRIEF DESCRIPTION OF DRAWINGS

FIG. 1 is a graph that illustrates a relationship between a voltage applied to a gate electrode of a transistor and a current flowing through a drain electrode of the transistor.

FIG. 2A is a schematic vertical cross-sectional view that illustrates a cross-sectional configuration of a transistor according to an embodiment of the present disclosure.

FIG. 2B is a plan view that illustrates a plane configuration of the transistor illustrated in FIG. 2A.

FIG. 2C is a vertical cross-sectional view that illustrates a positional relationship of a region in which a middle region and end regions with respect to a gate electrode, a source region, and a drain region.

FIG. 3 is a bird's-eye view that schematically illustrates the transistor according to the embodiment.

FIG. 4 is a schematic vertical cross-sectional view that explains a step in a manufacturing method of the transistor according to the embodiment.

FIG. 5 is a schematic vertical cross-sectional view that explains a step in the manufacturing method of the transistor according to the embodiment.

FIG. 6 is a schematic vertical cross-sectional view that explains a step in the manufacturing method of the transistor according to the embodiment.

FIG. 7 is a schematic vertical cross-sectional view that explains a step in the manufacturing method of the transistor according to the embodiment.

FIG. 8 is a schematic vertical cross-sectional view that explains a step in the manufacturing method of the transistor according to the embodiment.

FIG. 9 is a schematic vertical cross-sectional view that explains a step in the manufacturing method of the transistor according to the embodiment.

FIG. 10 is a schematic vertical cross-sectional view that explains a step in the manufacturing method of the transistor according to the embodiment.

FIG. 11 is a schematic vertical cross-sectional view that explains a step in the manufacturing method of the transistor according to the embodiment.

FIG. 12 is a schematic vertical cross-sectional view that explains a step in the manufacturing method of the transistor according to the embodiment.

FIG. 13 is a schematic vertical cross-sectional view that explains a step in the manufacturing method of the transistor according to the embodiment.

FIG. 14 is a circuit diagram that illustrates an example of an ESD protection circuit to which the transistor according to the embodiment is applicable.

FIG. 15A is an external view that illustrates an example of an electronic apparatus to which the transistor according to the embodiment. is applicable FIG. 15B is an external view that illustrates an example of the electronic apparatus to which the transistor according to the embodiment is applicable.

FIG. 15C is an external view that illustrates an example of the electronic apparatus to which the transistor according to the embodiment is applicable.

MODES FOR CARRYING OUT THE INVENTION

A preferable embodiment of the present disclosure is described in detail hereinbelow with reference to the accompanying drawings. It is to be noted that the same reference character is used for components with substantially the same functional configuration to avoid duplication of explanation in the present specification and the drawings.

It is to be noted that each of the drawings referred to herein below may exaggerate some component members for the convenience of description. Thus, relative sizes of the component members illustrated in the drawings do not necessarily accurately represent actual magnitude relationships among the component members. Furthermore, a direction of laminating a substrate or a layer may be referred to as an upper direction hereinbelow.

It is to be noted that description is given in the following order.
1. Embodiment of Present Disclosure
    1.1. Characteristics of Transistor
    1.2. Configuration of Transistor
    1.3. Bias Applied to Transistor
    1.4. Manufacturing Method of Transistor
2. Application Examples
    2.1. Application to ESD Protection Device
    2.2. Application to Electronic Apparatus
3. Summary

1. EMBODIMENT OF DISCLOSURE

1.1. Characteristics of Transistor

Referring to FIG. 1, characteristics of a transistor according to an embodiment of the present disclosure will be first described. FIG. 1 is a graph that illustrates a relationship between a voltage ($V_g$) applied to a gate electrode of a transistor and a current ($I_d$) flowing through a drain electrode of the transistor.

In recent years, portable devices, such as a smartphone, a tablet terminal, and a laptop, have been widely used. To increase operation times of such portable devices, various circuits installed in the portable devices need to consume less electricity. For example, a leakage current (also referred to as an off-state leakage current or an off-state current) flowing through a transistor when the transistor is not in operation needs to be reduced.

In this regard, to reduce the off-state current in the transistor, for example, it is considered that a threshold voltage ($V_{th}$), that is, an operation threshold of the transistor, may be controlled. In other words, it is possible to reduce the off-state current ($I_{off}@V_g=0$ V) by increasing the threshold voltage of the transistor as illustrated in FIG. 1.

Specifically, the threshold voltage ($V_{th}$) is given by Expression 1 below.

[Math. 1]

$$V_{th}=V_{fb}+2\Psi_b+4\sqrt{(4\varepsilon_{si}\cdot q\cdot Na\cdot \Psi_b)/C_{ox}} \quad \text{Expression 1}$$

In Expression 1, $V_{fb}$ denotes a flat band voltage (unit: V) and a second term ($2\Psi_b$) in a right side denotes a difference (unit: V) between a Fermi potential and an intrinsic potential. $\varepsilon_{si}$ denotes a permittivity of silicon and q is an electric charge (unit: C.) Na denotes an impurity concentration (unit: $m^{-3}$) in a semiconductor substrate for providing the transistor and $C_{ox}$ is a capacitance (unit: F) of a gate insulation film.

Furthermore, the flat band voltage ($V_{fb}$) in Expression 1 is expressed by Expression 2 below.

[Math. 2]

$$V_{fb}=\Phi_g-\Phi_s+q/C_{ox} \quad \text{Expression 2}$$

In Expression 2, $\Phi_g$ denotes a work function of the gate electrode and $\Phi_s$ denotes a work function of the semiconductor substrate for providing the transistor.

Accordingly, it is understandable from Expression 1 above that an increase in the flat band voltage $V_{fb}$ and the impurity concentration Na of the semiconductor substrate allows for an increase in the threshold voltage ($V_{th}$) of the transistor and, consequently, a reduction in the off-state current in the transistor. Further, it is also understandable from Expression 2 that an increase in the work function $\Phi_g$ of the gate electrode allows for an increase in the flat band voltage $V_{fb}$.

However, an increase in the work function $\Phi_g$ of the gate electrode increases a difference between the drain potential and the voltage applied to the gate electrode, causing a rapid change of an electric field within the channel. This results in an increase in a gate-induced-drain-leakage (Gate Induced Drain Leakage: GDIL) current at an end portion of the gate electrode. Accordingly, to reduce the off-state current in the transistor, it is important to restrain an increase in the GDIL current while increasing the threshold voltage ($V_{th}$) of the transistor. Specifically, it is necessary to reduce the difference between the drain potential at the end portion of the gate electrode and the voltage applied to the gate voltage while increasing the threshold voltage of the transistor as a whole.

A technology according to the present disclosure has been made in view of the above circumstances. The present disclosure provides a transistor with an off-state current being further reduced by increasing the threshold voltage (threshold voltage) of the transistor while restraining an increase in the GIDL current.

1.2. Configuration of Transistor

A configuration of the transistor according to the present embodiment will be described below with reference to FIGS. 2A and 2B. FIG. 2A is a schematic vertical cross-sectional view that illustrates a cross-sectional configuration of the transistor according to the embodiment. FIG. 2B is a plan view that illustrates a plane configuration of the transistor illustrated in FIG. 2A.

As illustrated in FIGS. 2A and 2B, a transistor 100 according to the present embodiment includes a semiconductor substrate 120 including a middle region 121 and end regions 123, a device separation layer 110, a buried insulation layer 127, a device region layer 141 provided with a source region 141S and a drain region 141D, a gate insulation film 131, and a gate electrode 130.

A substrate for providing the transistor 100 according to the present embodiment is a so-called SOI substrate, where, for example, the buried insulation layer 127 is provided inside the semiconductor substrate 120 and the device region layer 141 including a semiconductor is further provided on the buried insulation layer 127.

The semiconductor substrate 120, which contains an electrically-conductive impurity, is a substrate for providing a semiconductor unit such as the transistor 100. The semiconductor substrate 120 may be a substrate including polycrystalline, monocrystalline, or amorphous silicon (Si). Alternatively, the semiconductor substrate 120 may be a substrate including a compound semiconductor such as germanium (Ge), gallium arsenide (GaAs), gallium nitride (GaN), or silicon carbide (SiC). Further, the semiconductor substrate 120 may be a substrate in which a film of a semiconductor, such as silicon (Si), is formed on a substrate of a non-semiconductor material such as sapphire.

The electrically-conductive impurity contained in the semiconductor substrate 120 may be a p-type impurity such as boron (B) or aluminum (Al) or an n-type impurity such as phosphorus (P) or arsenic (As), for example.

In this regard, the semiconductor substrate 120 is divided into the middle region 121 and the end regions 123 on the basis of a concentration and a polarity of the contained electrically-conductive impurity. The middle region 121 and the end regions 123 are different from each other in the concentration and the polarity of the contained electrically-conductive impurity, allowing for locally controlling work functions of channel regions above the middle region 121 and the end regions 123. By locally varying the work function of the channel region, it is possible to change an electric field distribution within the gate insulation film 131 and, consequently, vary a local threshold voltage of the transistor 100. For example, the middle region 121 and the end regions 123 are provided in regions that are deeper than the buried insulation layer 127.

It is to be noted that the local threshold voltage of the transistor 100 means a threshold voltage per transistor on the assumption that the transistor 100 includes a plurality of transistors coupled in series from the drain region 141D to the source region 141S.

For example, in a case where the device region layer 141 is a first electrically-conductive type (e.g., p-type), the middle region 121 may be of the first electrically-conductive type (e.g., p-type) while the end regions 123 may be of a second electrically-conductive type (e.g., n-type.) Such a configuration allows for lowering the work function of the channel region above the middle region 121, thereby increasing the threshold voltage of the transistor 100 as a whole. Moreover, an increase in the work function of the channel region above each of the end regions 123 allows for reducing a difference in work function between the channel region above each of the end regions 123 and the gate electrode, thereby lowering a local threshold voltage in each of the end regions of the transistor 100. Accordingly, the transistor 100 allows for increasing the threshold voltage while restraining an increase in the GIDL current for a further reduction in the off-state current.

Alternatively, in the case of the device region layer 141 being of the first electrically-conductive type (e.g., p-type), the middle region 121 and the end regions 123 may be of the first electrically-conductive type (e.g., p-type) with different concentrations of the first electrically-conductive impurity. This also allows for achieving effects similar to those described above. For example, the concentration of the first electrically-conductive impurity in the middle region 121 may be set to be higher than the concentration of the first electrically-conductive impurity in each of the end regions 123. Such a configuration allows for making the work function of the channel region above the middle region 121 considerably lower than the work function of the channel region above each of the end regions 123. Accordingly, since it is possible to restrain an increase in the local threshold voltage in each of the end regions 123 of the transistor 100 while increasing the threshold voltage of the transistor 100 as a whole, the transistor 100 allows for restraining an increase in the GIDL current.

Furthermore, in the case of the device region layer 141 being of the first electrically-conductive type (e.g., p-type), the middle region 121 and the end regions 123 may be of the second electrically-conductive type (e.g., n-type) with different concentrations of the second electrically-conductive impurity. This also allows for achieving effects similar to those described above. For example, the concentration of the second electrically-conductive impurity in the middle region 121 may be set to be lower than the concentration of the second electrically-conductive impurity in each of the end regions 123. Such a configuration allows the channel region above the middle region 121 to have a larger difference in work function between the gate electrode 130 and the channel region than in the channel region above each of the end regions 123. Accordingly, it is possible to increase the threshold voltage of the transistor 100 as a whole while restraining an increase in the GIDL current by restraining an increase in the local threshold voltage at each of the end regions 123 of the transistor 100.

It is to be noted that, in a case where the first electrically-conductive type is the n-type and the second electrically-conductive type is the p-type, it is also possible to control the characteristics of the transistor 100 by locally controlling the work functions of the channel regions above the middle region 121 and the end regions 123 as described above. A specific region where each of the middle region 121 and the end regions 123 is provided will be described later.

It is also possible to apply a potential (also referred to as bias) to each of the middle region 121 and the end regions 123. In such a case, each of the middle region 121 and the end regions 123 may be so provided to include a region exposed on a surface of the semiconductor substrate 120 and a potential line may be coupled to the exposed region. For example, a potential line that allows for application of a potential may be coupled to each of the middle region 121 and the end regions 123 exposed on the surface of the semiconductor substrate 120 as illustrated in FIG. 2B. In other words, a potential line Body(D) may be electrically coupled to a drain-side end region 123 and a potential line Body(S) may be electrically coupled to a source-side end region 123. Furthermore, a potential line Body(Ch), which is not illustrated, may be electrically coupled to the middle region 121.

The device separation layer 110, which includes an insulating material, is provided toward inside of the semiconductor substrate 120 from the surface of the semiconductor substrate 120. The device separation layer 110 separates the device region layer 141 of the semiconductor substrate 120 per device, thereby electrically insulating each of the transistors of the transistor 100, provided on the semiconductor substrate 120. For example, the device separation layer 110 may be provided in a flat-surface region surrounding the device region layer 141. It is to be noted that, for application of the potential (bias) to each of the middle region 121 and the end regions 123, the device separation layer 110 is provided with an opening for exposing each of the middle region 121 and the end regions 123 on the surface of the semiconductor substrate 120. The device separation layer 110 thereby enables coupling of each of the middle region 121 and the end regions 123 to the corresponding potential line.

The device separation layer 110 may reach a region deeper than a depth where the buried insulation layer 127 described later is provided. This configuration allows the device separation layer 110 and the buried insulation layer 127 to separate the device region layer 141 from a substrate body where the middle region 121 and the end regions 123 of the semiconductor substrate 120 are provided. It is thereby possible to restrain the influence of the depletion layer in each of the source region 141S and the drain region 141D in the device region layer 141, thereby allowing for reducing the off-state current in the transistor 100.

For example, the device separation layer 110 may include an insulative inorganic oxynitride such as silicon oxide (SiO$_x$), silicon nitride (SiN$_x$), or silicon oxynitride (SiON.) Specifically, the device separation layer 110 can be formed by removing a portion of the semiconductor substrate 120 in a predetermined region defining a device region by, for example, etching and thereafter filling an opening formed by the etching with silicon oxide (SiO$_x$) according to an STI (Shallow Trench Isolation) method. Alternatively, the device separation layer 110 can be also formed by converting the semiconductor substrate 120 in the predetermined region defining the device region into an oxide by thermal oxidation according to an LOCOS (Local Oxidation of Silicon) method.

The buried insulation layer 127 is provided inside the semiconductor substrate 120 in the region defined by the device separation layer 110. The buried insulation layer 127, which functions as a BOX layer in a so-called SOI substrate, separates the device region layer 141 from the substrate body of the semiconductor substrate 120, thereby allowing for reducing, for example, a parasitic capacitance of the transistor 100 and the influence of the depletion layer extending from each of the source region 141S and the drain region 141D.

The buried insulation layer 127 may include an insulative inorganic oxynitride such as silicon oxide (SiO$_x$), silicon nitride (SiN$_x$), or silicon oxynitride (SiON.) Specifically, the SOI substrate including the buried insulation layer 127 may be formed by subsequently depositing the buried insulation layer 127 and the device region layer 141 on the substrate body of the semiconductor substrate 120. Alternatively, the SOI substrate including the buried insulation layer 127 may be formed by converting a predetermined internal region of the semiconductor substrate 120 into an oxide by thermal oxidation.

SOI substrates are classified into an FDSOI (Fully Depleted Silicon On Insulator) substrate and a PD (Partially Depleted Silicon On Insulator) substrate in accordance with the depth where the buried insulation layer 127 is provided (i.e., a thickness of the device region layer 141) and the semiconductor substrate 120 may be either one of the FDSOI substrate or the PDSOI substrate. It is to be noted that the semiconductor substrate 120 can include a compound semiconductor that is not silicon in the present embodiment as described above. Accordingly, it goes without saying that the expression "SOT substrate" is not intended to limit the semiconductor substrate 120 to a silicon substrate.

The device region layer 141, which is provided on the buried insulation layer 127 in the region defined by the device separation layer 110, includes a semiconductor that contains an electrically-conductive impurity. Specifically, the device region layer 141 may include the same material as the material of the semiconductor substrate 120. For example, the device region layer 141 may include polycrystalline, monocrystalline, or amorphous silicon (Si) or a compound semiconductor such as germanium (Ge), gallium arsenide (GaAs), gallium nitride (GaN), or silicon carbide (SiC.)

The device region layer 141 includes the source region 141S and the drain region 141D, each of which contains the electrically-conductive impurity different in polarity from the electrically-conductive impurity contained in the device region layer 141. Furthermore, the gate electrode 130 is provided with the gate insulation film 131 in between on a region sandwiched between the source region 141S and the drain region 141D, thereby providing the transistor 100.

Each of the source region 141S and the drain region 141D is a region that is provided in the device region layer 141 and contains the electrically-conductive impurity different from the electrically-conductive impurity contained in the device region layer 141. Specifically, the source region 141S and the drain region 141D may be formed by introducing the electrically-conductive impurity different from that of the device region layer 141 into regions opposed to each other with the gate electrode 130 and the gate insulation film 131 in between. For example, in a case where the device region layer 141 contains the first electrically-conductive impurity, the source region 141S and the drain region 141D may be formed by introducing the second electrically-conductive impurity.

The first electrically-conductive impurity may be, for example, a p-type impurity such as boron (B) or aluminum (Al) and the second electrically-conductive impurity may be, for example, an n-type impurity such as phosphorus (P) or arsenic (As.) Alternatively, the first electrically-conductive impurity may conversely be, for example, the n-type impurity such as phosphorus (P) or arsenic (As) and the second electrically-conductive impurity may be, for example, the p-type impurity such as boron (B) or aluminum (Al.)

The source region 141S and the drain region 141D are electrically coupled to a source (Source) node and a drain (Drain) node, thereby functioning as a source terminal and a drain terminal of the transistor 100, respectively. It is to be noted that either one of the source region 141S and the drain region 141D, which are formed with the gate electrode 130 in between, may function as the source region or the drain region and such functions may be exchanged as desired. Note, however, that the end region 123 is provided on the drain region 141D side as described above.

The gate insulation film 131 is provided on the semiconductor substrate 120, crossing the region where the device region layer 141 is provided. For example, the gate insulation film 131 may include an inorganic oxynitride such as silicon oxide ($SiO_x$), silicon nitride ($SiN_x$), or silicon oxynitride (SiON) or may include a dielectric material or a ferroelectric material such as hafnium oxide ($HfO_2$.)

The gate electrode 130 is provided on the gate insulation film 131. Specifically, the gate electrode 130 is provided on the semiconductor substrate 120 with the gate insulation film 131 in between, crossing the region where the device region layer 141 is provided. The gate electrode 130 is electrically coupled to the gate (Gate) node, functioning as a gate terminal of the transistor 100.

For example, the gate electrode 130 may include polysilicon or the like, or may include metal such as titanium (Ti), molybdenum (Mo), tantalum (Ta), tungsten (W), niobium (Nb), nickel (Ni), zirconium (Zr), gold (Au), silver (Ag), aluminum (Al), or copper (Cu) or an alloy or a metal compound of the above-described metal. Alternatively, the gate electrode 130 as formed may have a multilayer structure where a plurality of types of layers of the above materials are laminated. The gate electrode 130 with such a multilayer structure allows for, for example, lowering a wiring line resistance etc. and controlling a work function with a higher accuracy.

Now, description will be given of the region where each of the middle region 121 and the end regions 123 is provided with reference to FIG. 2C. FIG. 2C is a vertical cross-sectional view that illustrates a positional relationship between the region where each of the middle region 121 and the end regions 123 is provided and each of the gate electrode 130, the source region 141S, and the drain region 141D.

As illustrated in FIG. 2C, the end regions 123 are provided in the regions in the semiconductor substrate 120 below end portions 145, which are on the source region 141S side and on the drain region 141D side, of the region (also referred to as channel region) where the gate electrode 130 and the gate insulation film 131 are provided. The middle region 121 is provided in the region in the semiconductor substrate 120 below a middle portion 143 of the region where the gate electrode 130 and the gate insulation film 131 are provided.

Specifically, the end portion 145 of the channel region represents a region where an equipotential surface extends from the source region 141S or the drain region 141D toward the channel region. In other words, the end portion 145 of the channel region represents a region similar to a region, in the transistor 100 of the same generation, where LDD (Lightly Doped Drain) is formed. For example, such a region where the LDD is formed can be estimated by simulation etc. Meanwhile, the middle portion 143 of the channel region represents a region defined by eliminating the above-described end portion 145 of the channel region from the region where the gate electrode 130 and the gate insulation film 131 are provided.

More specifically, the end portion 145 of the channel region may correspond to a range from 5% to 15% on the end portion side of a total length of the region (i.e., channel region) where the gate electrode 130 and the gate insulation film 131 are provided or a range from 5% to 10% on the end portion side. For example, in a case where the total length of the channel region is 300 nm, a length of the end portion 145 of the channel region may be approximately in a range from 20 nm to 50 nm. In this case, a length of the middle portion 143 of the channel region is approximately in a range from 200 nm to 260 nm.

In the transistor 100 according to the present embodiment, the GDIL current increases with an increase in the difference between the drain potential and the voltage applied to the gate electrode 130. Accordingly, as long as the end region 123 is provided at least below the end portion 145, which is located on the drain region 141D side, of the region where the gate electrode 130 and the gate insulation film 131 are provided, the end region 123 does not need to be provided below the end portion 145 on the source region 141S side.

However, if configurations of the transistor 100, which include the source region 141S and the drain region 141D, are arranged axially symmetrically about the gate electrode 130, it is possible to further facilitate the manufacturing of the transistor 100. Accordingly, the end region 123 may be provided below the end portion 145, which is located on the source region 141S side, of the region where the gate electrode 130 and the gate insulation film 131 are provided. In such a case, it is possible to further facilitate the manufacturing of the transistor 100.

1.3. Bias Applied to Transistor

Next, description will be given of a bias applied to the transistor 100 according to the present embodiment with reference to FIG. 3. FIG. 3 is a bird's-eye view that schematically illustrates the transistor 100 according to the present embodiment. It is to be noted that configurations illustrated in FIG. 3, which are similar to the configurations described with reference to FIGS. 2A to 2C, are not described here.

As illustrated in FIG. 3, the end region 123 on the source region 141S side and the end region 123 on the drain region 141D side, each of which is exposed on the surface of the semiconductor substrate 120, are electrically coupled to the potential line Body(D) and the potential line Body(S), respectively. Further, the middle region 121, which is also exposed on the surface of the semiconductor substrate 120, is electrically coupled to the potential line Body(Ch).

In the transistor 100 according to the present embodiment, respective biases are applied through the potential line Body(D), the potential line Body(S), and the potential line Body(Ch) to the middle region 121 and the end regions 123, thereby allowing for a further reduction in the off-state current.

Specifically, a bias with a potential higher than that of a bias for the middle region 121 may be applied to the end region 123 on the drain region 141D side through the potential line Body(D) and the potential line Body(Ch). This allows for controlling the local threshold voltage above the middle region 121 of the transistor 100 to be higher than the local threshold voltage above the end region 123 on the drain region 141D side.

For example, a bias with a negative potential (also referred to as back bias) may be applied to the middle region 121 of the transistor 100 whereas a bias with a positive potential (also referred to as forward bias) may be applied to the end region 123 on the drain region 141D side. In such a case, it is possible to increase a difference between the voltage applied to the middle region 121 and the voltage applied to the end region 123 on the drain region 141D side without the necessity of increasing an absolute value of the potential of the bias. This allows for applying the bias with a potential generated by an internal circuit to the semiconductor substrate 120 without the necessity of providing another circuit for generating a potential of a bias to be applied.

A combination of a potential Vb(ch) to be applied to the middle region 121 and a potential Vb(d) to be applied to the end region 123 on the drain region 141D side may be, for example, any one of combinations described in Table 1 below.

TABLE 1

|  | Vb(ch) [V] | Vb(d) [V] |
|---|---|---|
| Combination Ex. 1 | −1 | 0 |
| Combination Ex. 2 | −2 | 0 |
| Combination Ex. 3 | −1 | +1 |
| Combination Ex. 4 | −2 | +1 |
| Combination Ex. 5 | −2 | +2 |

It is to be noted that the potential to be applied to the end region 123 on the source region 141S side through the potential line Body(S) is not particularly limited. For example, the potential to be applied to the end region 123 on the source region 141S side may be a ground potential.

1.4. Manufacturing Method of Transistor

Next, description will be given of a manufacturing method of the transistor 100 according to the present embodiment with reference to FIGS. 4 to 13. FIGS. 4 to 13 are schematic vertical cross-sectional views that illustrate steps in the manufacturing method of the transistor 100 according to the present embodiment.

Description will be given below of a manufacturing method for a case where the transistor 100 is an n-type transistor. A manufacturing method for a case where the transistor 100 is a p-type transistor is substantially almost the same as that for the case where the transistor 100 is the n-type transistor except that the polarities of the electrically-conductive impurities to be introduced are reversed and therefore not described herein.

First, as illustrated in FIG. 4, an SOI substrate is prepared where the buried insulation layer 127 and the semiconductor layer 140 are deposited on the semiconductor substrate 120. Specifically, an SOI substrate is prepared that is formed by depositing the buried insulation layer 127 of $SiO_x$ with a thickness of approximately 30 nm on the semiconductor substrate 120 of silicon and depositing a film of silicon with a thickness of approximately 10 nm on the buried insulation layer 127.

Subsequently, as illustrated in FIG. 5, a photoresist 151 is deposited on the semiconductor layer 140 and the deposited photoresist 151 is patterned by, for example, lithography. Specifically, the photoresist 151 deposited on the semiconductor layer 140 is patterned by, for example, lithography, thereby covering a region where the device region layer 141 is to be formed while exposing a region where the device separation layer 110 is to be formed.

Next, as illustrated in FIG. 6, openings 111 are formed by etching the semiconductor layer 140, the buried insulation layer 127, and the semiconductor substrate 120 with the use of the photoresist 151 as a mask. For example, a depth of the openings 111 formed by etching may be 200 nm from a surface of the semiconductor layer 140.

Subsequently, as illustrated in FIG. 7, the openings 111 is filled with an insulating material after removing the photoresist 151, thereby forming the device separation layer 110. Specifically, after removal of the photoresist 151, for example, $SiO_x$ is deposited all over the surface of the semiconductor layer 140 and flattened by CMP (Chemical Mechanical Polishing) until the semiconductor layer 140 is exposed, thereby forming the device separation layer 110.

Subsequently, as illustrated in FIG. 8, a photoresist 153 is deposited on the semiconductor layer 140 and the device separation layer 110 and the deposited photoresist 153 is patterned by, for example, lithography. Specifically, the photoresist 153 is patterned by, for example, lithography, allowing a region surrounded by the device separation layer 110 and the device separation layer 110 (i.e., a region to be a device region 141 in a subsequent step) to be covered with the photoresist 151.

Next, as illustrated in FIG. 9, the semiconductor layer 140, the buried insulation layer 127, and the semiconductor substrate 120 are etched with the use of the photoresist 153 as a mask. For example, an etching depth may be shallower than a depth to which the device separation layer 110 is formed.

Subsequently, the photoresist 153 is removed as illustrated in FIG. 10.

As illustrated in FIG. 11, ions are thereafter injected into the semiconductor substrate 120 with the use of a photoresist 155 as a mask, thereby forming each of the end regions 123. Specifically, the deposited photoresist 155 is patterned by, for example, lithography, thereby covering middle of the semiconductor layer 140. Subsequently, with the use of the patterned photoresist 155 as a mask, an n-type electrically-conductive impurity such as phosphorus (P) is injected into the semiconductor substrate 120 at 200 kV with a concentration of $1.3 \times 10^{13}$ $cm^{-2}$, thereby forming the end region 123.

Next, as illustrated in FIG. 12, ions are injected into the semiconductor substrate 120 with the use of a photoresist 157 as a mask, thereby forming the middle region 121. Specifically, the deposited photoresist 157 is patterned by, for example, lithography, thereby providing an opening in the middle of the semiconductor layer 140. Subsequently, with the use of the patterned photoresist 157 as a mask, a p-type electrically-conductive impurity such as boron (B) is injected into the semiconductor substrate 120 at 100 kV with a concentration of $1.5 \times 10^{13}$ $cm^{-2}$, thereby forming the middle region 121. It is to be noted that a width of the opening of the photoresist 157 for forming the middle region 121 may be, for example, approximately 240 nm.

Furthermore, as illustrated in FIG. 13, the device region layer 141 is formed after removal of the photoresist 157. Subsequently, the gate insulation film 131 and the gate electrode 130 are formed and the source region 141S and the drain region 141D are formed. Specifically, the device region layer 141 can be formed by introducing a p-type electrically-conductive impurity such as boron (B) into the semiconductor layer 140. The gate insulation film 131 can be formed by depositing and patterning $SiO_x$ etc. The gate electrode 130 can be formed by depositing and patterning a metal material, such as titanium (Ti), molybdenum (Mo), or tantalum (Ta), polysilicon, etc. Furthermore, the source region 141S and the drain region 141D can each be formed by introducing an n-type electrically-conductive impurity such as phosphorus (P) into the device region layer 141 with the use of the gate electrode 130 and the gate insulation film 131 as a mask.

In this regard, the region where the gate insulation film 131 and the gate electrode 130 are formed may have a width of approximately 300 nm, which is sufficient to include the middle region 121 while overlapping the end region 123. In this case, the region where the gate insulation film 131 and the gate electrode 130 overlaps the end region 123 on each of the source region 141S side and the drain region 141D side by 30 nm.

It is to be noted that the coupling of the potential line to the end region 123 is allowed in the end region 123 exposed by etching. The coupling of the potential line to the middle region 121 is allowed in an unillustrated exposed surface of the middle region 121 provided on farthest end side of the gate electrode 130.

It is possible to form the transistor 100 according to the present embodiment through the above steps.

2. APPLICATION EXAMPLES

2.1. Application to ESD Protection Circuit

For example, the transistor 100 according to the embodiment of the present disclosure may be applied to a transistor in an ESD protection circuit that prevents an internal circuit from being broken by electro-static discharge (Electro-Static Discharge: ESD.) Description will be given of an example of the ESD protection circuit to which the transistor 100 according to the present embodiment is applicable with reference to FIG. 14. FIG. 14 is a circuit diagram that illustrates the example of the ESD protection circuit to which the transistor 100 according to the present embodiment is applicable.

As illustrated in FIG. 14, an ESD protection circuit 10 is a circuit for protecting an internal circuit 15 from an ESD surge. The ESD protection circuit 10 includes a resistive device 11, a capacitive device 12, a CMOS inverter 13, and a clamp transistor 14, which are disposed between a power wiring line 1 and a ground wiring line 2. It is to be noted that a power supply voltage Vdd is supplied to the power wiring line 1. Meanwhile, the ground wiring line 2 is set at a ground potential Vss by being coupled to a ground terminal.

Specifically, the resistive device 11 may be a resistive device or the like including a material such as polysilicon. For example, a gate electrode of an MOS transistor including polysilicon may be used as the resistive device 11. It is possible to control a resistance value of the resistive device 11 on the basis of a device size of the resistive device 11.

Specifically, the capacitive device 12 may be a capacitive device with a low bias dependence. For example, a capacitor using a gate insulation film of an MOS transistor as a dielectric or a capacitor using an insulation film between wiring layers as a dielectric may be used as the capacitive device 12. It is possible to control a capacitance value of the capacitive device 12 on the basis of a device size of the capacitive device 12.

The resistance value of the resistive device 11 and the capacitance value of the capacitive device 12 may each be designed to be a value allowing a time constant of an RC series circuit, which includes the resistive device 11 and the capacitive device 12, to be a desired value in consideration of an application use of the ESD protection circuit 10 and an assumed model of an ESD surge current. The resistance value of the resistive device 11 may be designed, for example, within a range from 1000Ω to 10 MΩ as desired and the resistance value of the capacitive device 12 may be designed, for example, within a range from 1 pF to 10 pF as desired.

For example, assuming that the model of the ESD surge current is an HBM (Human Body Model), the RC series circuit is designed to have a time constant of approximately 1 μsec as a rough guide. In this case, if the resistance value (R) of the resistive device 11 is 1 MΩ and the capacitance value (C) of the capacitive device 12 is 1 pF, it is possible to design the time constant of the RC series circuit to be R×C=1 MΩ×1 pF=1 μsec.

A potential (voltage signal) at a coupling point between the resistive device 11 and the capacitive device 12 is inputted to the CMOS inverter 13 and a reversed inputted potential is outputted to a gate of the clamp transistor 14 from the CMOS inverter 13.

The clamp transistor 14 has a drain coupled to the power wiring line 1, a source coupled to the ground wiring line 2, and a gate coupled to an output of the CMOS inverter 13. Accordingly, an on-off control of the clamp transistor 14 is performed in response to an output signal (voltage signal) from the CMOS inverter 13. Further, the drain of the clamp transistor 14 is coupled to a well. It is to be noted that the clamp transistor 14 may include the transistor 100 according to the present embodiment.

Furthermore, for example, a back bias may be applied to the clamp transistor 14 as described above. Specifically, a substrate potential Vb(d), which is a positive potential, may be applied to the drain-side end region 123 of the clamp transistor 14 while a substrate potential Vb(ch), which is a negative potential, may be applied to the middle region 121 of the clamp transistor 14. It is to be noted that the source-side end region 123 of the clamp transistor 14 may be coupled to the ground wiring line 2, allowing the ground potential Vss to be applied as a substrate potential Vb(s) to the end region 123.

In this regard, if an ESD surge (high-voltage pulse) is applied to the ESD protection circuit 10, a through-current flows through the RC series circuit, which includes the resistive device 11 and the capacitive device 12, varying a voltage level at an input end of the CMOS inverter 13 from a "High" level to a "Low" level. In this regard, a voltage signal at the "High" level, which is a reversal of the "Low" level, is applied to the gate of the clamp transistor 14 from an output end of the CMOS inverter 13. The clamp transistor 14 is thus turned to an on-state (conducting state), causing an ESD surge current to flow between the drain and the source of the clamp transistor 14. The ESD surge current is thereby discharged into the ground wiring line 2.

By the above operation, the ESD protection circuit 10 is able to protect the internal circuit 15 from the ESD surge current. The clamp transistor 14 in the ESD protection circuit 10, which is turned to the on-state in response to occurrence of the ESD surge current, is kept in an off-state during standby. Therefore, by applying the transistor 100 according to the present embodiment to the clamp transistor 14 to reduce an off-state current, it is possible to reduce power consumption of the ESD protection circuit 10 during standby.

2.2. Application to Electronic Apparatus

The transistor 100 according to the embodiment of the present disclosure may be applied to devices in circuits provided in a variety of electronic apparatuses. Now, description will be given of examples of an electronic apparatus to which the transistor 100 according to the present embodiment is applicable, with reference to FIGS. 15A to 15. Each of FIGS. 15A to 15C is an external view that illustrates an example of the electronic apparatus to which the transistor 100 according to the present embodiment is applicable.

For example, the transistor 100 according to the present embodiment is applicable to a device in a circuit provided in an electronic apparatus such as a smartphone. Specifically, as illustrated in FIG. 15A, a smartphone 900 includes a display unit 901 that displays a variety of pieces of information and an operation unit 903 including a button where an operation by a user is inputted etc. In this case, the transistor 100 according to the present embodiment may be applied to a device in a control circuit that controls a variety of operations of the smartphone 900.

For example, the transistor 100 according to the present embodiment is applicable to a device in a circuit provided in an electronic apparatus such as a digital camera. Specifically, as illustrated in FIGS. 15B and 15C, a digital camera 910 includes a body (camera body) 911, a replaceable lens unit 913, a grip unit 915 to be held by a user during shooting, a monitor unit 917 that displays a variety of pieces of information, and an EVF (Electronic View Finder) 919 that displays a through image viewed by the user during shooting. It is to be noted that FIG. 15B is an external view of the digital camera 910 as viewed from front (i.e., a subject side) and FIG. 15C is an external view of the digital camera 910 as viewed from rear (i.e., a photographer side.) In this case, the transistor 100 according to the present embodiment may be applied to a device in a control circuit that controls a variety of operations of the digital camera 910.

It is to be noted that the electronic apparatus to which the transistor 100 according to the present embodiment is applied is not limited to the examples described above. The transistor 100 according to the present embodiment is applicable to a device in a circuit provided in an electronic apparatus in any field. For example, such an electronic apparatus may be exemplified by a wearable device in a form of eyeglasses, an HMD (Head Mounted Display), a television apparatus, an electronic book, a PDA (Personal Digital Assistant), a laptop personal computer, a video camera, a game device, or the like.

3. SUMMARY

As described above, the transistor 100 according to the embodiment of the present disclosure allows for controlling the polarity or concentration of the electrically-conductive impurity contained in the semiconductor substrate 120 under the buried insulation layer 127, thereby controlling the local threshold voltage of the transistor 100. The transistor 100 is thereby able to increase the threshold voltage of the transistor 100 as a whole while suppressing an increase in the GIDL current, achieving desired transistor characteristics for a reduction in the off-state current Although detailed description has been given of the preferred embodiment of the present disclosure with reference to the attached drawings, the technical scope of the present disclosure is not limited to such examples. It is clear that those having ordinary knowledge in the art to which the present disclosure pertains would think of a variety of alterations and modifications within the scope of the technical idea according to the claims and it is, of course, understood that such alterations and modifications also belong to the technical scope of the present disclosure.

Furthermore, the effects described herein are merely illustrative or exemplary but not limiting. In other words, the technology according to the present disclosure is able to achieve any other effect clear to those skilled in the art from the description herein in addition to or instead of the above effects.

It is to be noted that the following configurations are also within the technical scope of the present disclosure.

(1)

A transistor including:

a semiconductor substrate containing an electrically-conductive impurity;

a device separation layer provided toward inside of the semiconductor substrate from a surface of the semiconductor substrate, the device separation layer defining a device region;

a buried insulation layer provided inside the semiconductor substrate in the device region;

a gate electrode provided on the semiconductor substrate with a gate insulation film in between, the gate electrode crossing the device region; and a drain region and a source region provided in respective regions that are opposed to each other with the gate electrode in between in the device region, in which a concentration or a polarity of the electrically-conductive impurity in the semiconductor substrate in an end region including at least an end portion of the gate electrode on drain region side is different from a concentration or a polarity of the electrically-conductive impurity in the semiconductor substrate in a middle region including a middle portion of the gate electrode.

(2)

The transistor according to (1) described above, in which the polarity of the electrically-conductive impurity in the semiconductor substrate in the end region is same as the polarity of the electrically-conductive impurity in the semiconductor substrate in the middle region, and the concentration of the electrically-conductive impurity in the semiconductor substrate in the middle region is higher than the concentration of the electrically-conductive impurity in the semiconductor substrate in the end region.

(3)

The transistor according to (1) described above, in which the polarity of the electrically-conductive impurity in the semiconductor substrate in the middle region is reverse to the polarity of the electrically-conductive impurity in the semiconductor substrate in the end region.

(4)

The transistor according to (3) described above, in which the end region is electrically coupled to a potential line that enables application of a higher potential than that in the middle region.

(5)
The transistor according to (4) described above, in which the middle region is electrically coupled to a potential line that enables application of a negative potential.

(6)
The transistor according to any one of (1) to (5) described above, in which the device separation layer reaches a region that is deeper in the semiconductor substrate than a depth where the buried insulation layer is provided.

(7)
The transistor according to (6) described above, in which the concentration and the polarity of the electrically-conductive impurity in the semiconductor substrate in the end region are different from the concentration and the polarity of the electrically-conductive impurity in the semiconductor substrate in the middle region, in the region deeper than a region where the buried insulation layer is provided.

(8)
The transistor according to any one of (1) to (7) described above, in which the end region further includes an end portion of the gate electrode on source region side.

(9)
The transistor according to (8) described above, in which the transistor is axially symmetric about the gate electrode.

(10)
The transistor according to any one of (1) to (9) described above, in which the transistor is provided in a circuit included in a protection device.

(11)
An electronic apparatus including a circuit including a transistor, the transistor including
a semiconductor substrate containing an electrically-conductive impurity,
a device separation layer provided toward inside of the semiconductor substrate from a surface of the semiconductor substrate, the device separation layer defining a device region,
a buried insulation layer provided inside the semiconductor substrate in the device region,
a gate electrode provided on the semiconductor substrate with a gate insulation film in between, the gate electrode crossing the device region, and
a drain region and a source region provided in respective regions that are opposed to each other with the gate electrode in between in the device region, in which
a concentration or a polarity of the electrically-conductive impurity in the semiconductor substrate in an end region including at least an end portion of the gate electrode on drain region side is different from a concentration or a polarity of the electrically-conductive impurity in the semiconductor substrate in a middle region including a middle portion of the gate electrode.

DESCRIPTION OF REFERENCE SIGNS

1 power wiring line
2 ground wiring line
10 protection circuit
11 resistive device
12 capacitive device
13 inverter
14 clamp transistor
15 internal circuit
100 transistor
110 device separation layer
120 semiconductor substrate
121 middle region
123 end region
127 buried insulation layer
130 gate electrode
131 gate insulation film
141 device region layer
141D drain region
141S source region

The invention claimed is:

1. A transistor comprising:
   a semiconductor substrate containing an electrically-conductive impurity;
   a device separation layer provided toward inside of the semiconductor substrate from a surface of the semiconductor substrate, the device separation layer defining a device region;
   a buried insulation layer provided inside the semiconductor substrate in the device region;
   a gate electrode provided on the semiconductor substrate with a gate insulation film in between, the gate electrode crossing the device region; and
   a drain region and a source region provided in respective regions that are opposed to each other along a first direction with the gate electrode in between in the device region, wherein
   the electrically-conductive impurity in the semiconductor substrate is resident in a middle region and end regions, the middle region being located under the gate electrode, the end regions being respectively located under the drain region and the source region, the end regions being in contact with the buried insulating layer, at least portions of the end regions being under the gate electrode along respective axes extending through the gate electrode in a second direction perpendicular to the first direction, and
   a concentration or a polarity of the electrically-conductive impurity in the end regions is different from a concentration or a polarity of the electrically-conductive impurity in the middle region.

2. The transistor according to claim 1, wherein the polarity of the electrically-conductive impurity in the semiconductor substrate in the middle region is reverse to the polarity of the electrically-conductive impurity in the semiconductor substrate in the end regions.

3. The transistor according to claim 2, wherein
   a semiconductor substrate containing an electrically-conductive impurity;
   a device separation layer provided toward inside of the semiconductor substrate from a surface of the semiconductor substrate, the device separation layer defining a device region;
   a buried insulation layer provided inside the semiconductor substrate in the device region;
   a gate electrode provided on the semiconductor substrate with a gate insulation film in between, the gate electrode crossing the device region; and
   a drain region and a source region provided in respective regions that are opposed to each other along a first direction with the gate electrode in between in the device region, wherein
   the electrically-conductive impurity in the semiconductor substrate is resident in a middle region and end regions, the middle region being located under the gate electrode, the end regions being respectively located under the drain region and the source region, the end regions being in contact with the buried insulating layer, at least portions of the end regions being under the gate electrode along a second direction perpendicular to the first direction, a concentration or a polarity of the electrically-conductive impurity in the end regions is different from a concentration or a polarity of the electrically-conductive impurity in the middle region, the polarity of the electrically-conductive impurity in the semiconductor substrate in the middle region is reverse to the polarity of the electrically-conductive impurity in the semiconductor substrate in the end regions, and at least one of the end regions is electrically coupled to a potential line that enables application of a higher potential than that in the middle region.

4. The transistor according to claim 3, wherein the middle region is electrically coupled to a potential line that enables application of a negative potential.

5. An electronic apparatus comprising a circuit including a transistor according to claim 3.

6. The electronic apparatus according to claim 5, wherein the middle region is electrically coupled to a potential line that enables application of a negative potential.

7. The transistor according to claim 1, wherein the device separation layer reaches a region that is deeper in the semiconductor substrate than a depth where the buried insulation layer is provided.

8. The transistor according to claim 7, wherein the concentration and the polarity of the electrically-conductive impurity in the semiconductor substrate in the end regions are different from the concentration and the polarity of the electrically-conductive impurity in the semiconductor substrate in the middle region, in the region deeper than a region where the buried insulation layer is provided.

9. The transistor according to claim 1, wherein the transistor is axially symmetric about the gate electrode.

10. The transistor according to claim 1, wherein the transistor is provided in a circuit included in a protection device.

11. An electronic apparatus comprising a circuit including a transistor according to claim 1.

12. The electronic apparatus according to claim 11, wherein the polarity of the electrically-conductive impurity in the semiconductor substrate in the middle region is reverse to the polarity of the electrically-conductive impurity in the semiconductor substrate in the end regions.

13. The electronic apparatus according to claim 11, wherein the device separation layer reaches a region that is deeper in the semiconductor substrate than a depth where the buried insulation layer is provided.

14. The electronic apparatus according to claim 13, wherein the concentration and the polarity of the electrically-conductive impurity in the semiconductor substrate in the end regions are different from the concentration and the polarity of the electrically-conductive impurity in the semiconductor substrate in the middle region, in the region deeper than a region where the buried insulation layer is provided.

15. The electronic apparatus according to claim 11, wherein the transistor is axially symmetric about the gate electrode.

16. The electronic apparatus according to claim 11, wherein the transistor is provided in a circuit included in a protection device.

17. The electronic apparatus according to claim 11, wherein the device separation layer is one of two device separation layers forming the device region respectively at drain and source region sides, and the end regions extend beyond the device separation layers along the first direction.

18. The transistor according to claim 1, wherein the device separation layer is one of two device separation layers forming the device region respectively at drain and source region sides, and the end regions extend beyond the device separation layers along the first direction.

19. A transistor comprising:
a semiconductor substrate containing an electrically-conductive impurity;
a device separation layer provided toward inside of the semiconductor substrate from a surface of the semiconductor substrate, the device separation layer defining a device region;
a buried insulation layer provided inside the semiconductor substrate in the device region;
a gate electrode provided on the semiconductor substrate with a gate insulation film in between, the gate electrode crossing the device region; and
a drain region and a source region provided in respective regions that are opposed to each other along a first direction with the gate electrode in between in the device region, wherein
the electrically-conductive impurity in the semiconductor substrate is resident in a middle region and end regions, the middle region being located under the gate electrode, the end regions being respectively located under the drain region and the source region, the end regions being in contact with the buried insulating layer, at least portions of the end regions being under the gate electrode along a second direction perpendicular to the first direction,
a concentration or a polarity of the electrically-conductive impurity in the end regions is different from a concentration or a polarity of the electrically-conductive impurity in the middle region,
the polarity of the electrically-conductive impurity in the semiconductor substrate in the end regions is same as the polarity of the electrically-conductive impurity in the semiconductor substrate in the middle region, and
the concentration of the electrically-conductive impurity in the semiconductor substrate in the middle region is higher than the concentration of the electrically-conductive impurity in the semiconductor substrate in the end regions.

20. An electronic apparatus comprising a circuit including a transistor according to claim 12.

* * * * *